United States Patent
Perry et al.

(10) Patent No.: US 6,652,668 B1
(45) Date of Patent: Nov. 25, 2003

(54) HIGH-PURITY FERROMAGNETIC SPUTTER TARGETS AND METHOD OF MANUFACTURE

(75) Inventors: Andrew C. Perry, Oradell, NJ (US); Holger J. Koenigsmann, Congers, NY (US); David E. Dombrowski, Tuxedo Park, NY (US); Thomas J. Hunt, Peekskill, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 10/158,164

(22) Filed: May 31, 2002

(51) Int. Cl.[7] .............................. H01F 1/14; C21D 6/04
(52) U.S. Cl. ........................................ 148/120; 148/577
(58) Field of Search ................................ 148/100, 120, 148/121, 122, 577

(56) References Cited

U.S. PATENT DOCUMENTS

| | | | |
|---|---|---|---|
| 4,159,217 A | 6/1979 | Selines et al. ............. | 148/11.5 |
| 4,643,779 A | * 2/1987 | Abbaschian et al. ........ | 148/577 |
| 5,766,380 A | * 6/1998 | Lo et al. ..................... | 148/577 |
| 5,810,983 A | 9/1998 | Shindo et al. ......... | 204/298.13 |
| 5,993,575 A | 11/1999 | Lo et al. ..................... | 148/577 |
| 6,056,857 A | * 5/2000 | Hunt et al. ............ | 204/192.15 |
| 6,176,944 B1 | 1/2001 | Snowman et al. .......... | 148/121 |
| 6,197,129 B1 | 3/2001 | Zhu et al. ................... | 148/400 |

FOREIGN PATENT DOCUMENTS

| | | |
|---|---|---|
| EP | 799905 | 10/1997 |
| JP | 3115562 | 5/1991 |

* cited by examiner

*Primary Examiner*—John Sheehan
(74) *Attorney, Agent, or Firm*—Iurie Schwartz

(57) ABSTRACT

The method manufactures high-purity ferromagnetic sputter targets by cryogenic working the sputter target blank at a temperature below at least −50° C. to impart at least about 5 percent strain into the sputter target blank to increase PTF uniformity of the target blank. The sputter target blank is a nonferrous metal selected from the group consisting of cobalt and nickel; and the nonferrous metal has a purity of at least about 99.99 weight percent. Finally, fabricating the sputter target blank forms a sputter target having an improved PTF uniformity arising from the cryogenic working.

14 Claims, 1 Drawing Sheet

HIGH-PURITY FERROMAGNETIC SPUTTER TARGETS AND METHOD OF MANUFACTURE

FIELD OF THE INVENTION

This invention relates to the field of high-purity cobalt and nickel sputter targets. In particular, this invention relates to low-permeability cobalt and nickel sputter targets.

BACKGROUND OF THE INVENTION

In recent years, manufacturers have relied upon several processing techniques to manufacture sputter targets from pure cobalt and pure nickel. Manufacturers have traditionally relied upon a combination of hot working and cold working to lower sputter targets' permeability and increase its magnetic pass through flux (PTF). Unfortunately, these processes have limited success with respect to controlling the high-purity target's final magnetic properties. The target's high magnetic permeability and low PTF in turn limit the target's useful thickness to a relatively thin cross section. Furthermore, because the performance of a ferromagnetic sputter target is extremely sensitive to minor variations in magnetic properties, production of a critically-uniform ferromagnetic target is also challenging. Finally, the magnetic properties of a ferromagnetic sputter target are themselves a means to an end—the ultimate measure of improvement is the performance of the target in a sputtering system.

Kano et al., in EP 799905, recognized that strain can manipulate a high-purity cobalt target's permeability. This patent publication discloses a process that relies upon either cold or warm rolling to reduce the target's initial permeability parallel to the target's surface to about 7. Unfortunately, this process also increases the permeability perpendicular to the target's surface.

Snowman et al., in U.S. Pat. No. 6,176,944, disclose another process for reducing permeability of high-purity cobalt targets. This process relies upon: i) controlled cooling to produce an hcp structure; ii) hot working; iii) further controlled cooling to reproduce the hcp structure; and iv) cold working to lower the target's permeability. This process lowers the target's initial permeability to less than 9. The cobalt targets produced by this process, however, do not suffer from the severe anisotropic magnetic permeability of the Kano et al. process.

Lo et al., in U.S. Pat. No. 5,766,380, entitled "Method for Fabricating Randomly Oriented Aluminum Alloy Sputtering Targets with Fine Grains and Fine Precipitates" disclose a cryogenic method for fabricating aluminum alloy sputter targets. This method uses cryogenic processing with a final annealing step to recrystallize the grains into a desired texture. Similarly, Y. Liu, in U.S. Pat. No. 5,993,621, uses cryogenic working and annealing to manipulate and enhance crystallographic texture of titanium sputter targets.

Sawada et al., in Japan Pat. Pub. No. 3-115,562, disclose a cryogenic process for lowering the permeability of cobalt alloy targets. These cobalt alloy targets contained a combination of fcc and hcp phases. This process used cryogenic working at a temperature of −196° C. to further reduce magnetic permeability of the two phase cobalt alloy target.

Researchers have explored using cryogenic working to increase the forming limits of aluminum alloy sheet panels. For example, Selines et al. disclose a cryogenic process for deforming aluminum sheet in U.S. Pat. No. 4,159,217. This cryogenic process increases elongation and formability at −196° C. In addition, metal sheet forming industries have exploited high strain-hardening rates to extend the forming limits of sheet metal and improve sheet metal strain accommodation uniformity.

SUMMARY OF THE INVENTION

The method manufactures high-purity ferromagnetic sputter targets by cryogenic working the sputter target blank at a temperature below at least −50° C. to impart at least about 5 percent strain into the sputter target blank to increase PTF uniformity of the ferromagnetic target blank. The sputter target blank is a nonferrous metal selected from the group consisting of cobalt and nickel; and the nonferrous metal has a purity of at least about 99.99 weight percent. Finally, fabricating the sputter target blank forms a sputter target having an improved PTF uniformity arising from the cryogenic working.

The method forms a high-purity nonferrous sputter target. The nonferrous sputter target has a sputter source selected from the group consisting of cobalt and nickel. The sputter source has a top surface for sputtering metal atoms onto a substrate, a side edge, a purity of at least about 99.99 weight percent and a uniform PTF. The PTF uniformity is less than about 3 percent of the average PTF for the formula provided in the specification.

DETAILED DESCRIPTION

Figure 1:
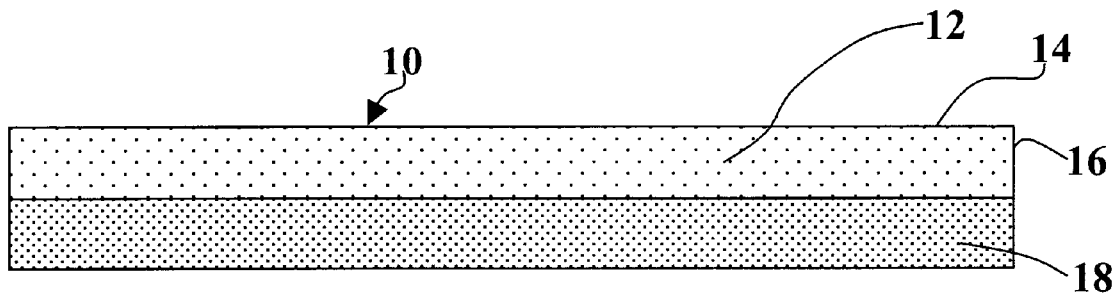
FIG. 1 is a schematic drawing of a sputter target used to illustrate acceptable locations for measuring PTF.

The process provides a method for manufacturing high-purity cobalt and high-purity nickel sputter targets with fine grain sizes, low permeability, high PTF (PTF as measured with reference to ASTM standard F1761-96), and enhanced material property uniformity. The low permeability and high PTF increase the sputter target's performance and allow for the manufacture of targets having increased thickness. In addition to this increased thickness, the process improves PTF and grain size uniformity throughout the target's matrix. This in turn facilitates sputtering with improved deposited wafer film uniformity throughout the target's life.

The structure-sensitive material property uniformity of a given metal workpiece is highly dependent upon the uniformity of imposed thermomechanical treatments that affect microstructural evolution. For deformation sequences, great advancements in deformation uniformity can be achieved by increasing the strain-hardening rate of the metal being worked. Increasing the strain-hardening rate of a metal causes imposed strain to be more evenly accommodated throughout the workpiece, and increases overall deformed-state uniformity. In ferromagnetic sputter targets the uniformity of the material magnetic properties is absolutely critical for the performance of the target in producing uniformly sputtered films. Furthermore, metalworking conditions that maximize strain-hardening rate ensure the most uniformly distributed deformation. Applying deformation at cryogenic temperatures is particularly effective for increasing the strain-hardening rate of high-purity metals. For high-purity metals, which traditionally can exhibit particularly low strain-hardening rates, cryogenic working significantly increases strain-hardening rates and ultimately improves uniformity of the accommodated deformation. For alloyed metals however, cryogenic deformation is less effective at increasing strain-hardening rates above the inherent (relatively high) strain-hardening rates of alloy materials. For nonferrous-ferromagnetic materials, increasing the strain-hardening rate leads to uniform deformation and uniform material magnetic properties.

The process operates effectively with high-purity nonferrous metals cobalt and nickel—these metals' ferromagnetic properties limit sputter target design and operation. The nonferrous sputter target has a purity of at least about 99.99 weight percent. For purposes of this specification, all concentrations are in weight percent. Advantageously, the nonferrous targets have a purity of at least about 99.995 weight percent and most advantageously at least about 99.999 weight percent.

For the high-purity cobalt targets, the process most advantageously first involves heating a cobalt target blank to a temperature of at least about 417° C. At temperatures above about 417° C., the cobalt matrix transforms into its fcc phase structure for improved workability. Advantageously, the hot working occurs at a temperature of at least about 500° C. for improved workability. In addition, it is possible to hot work the blank at a temperature as high as about 1450° C. But these high temperatures often lead to uncontrolled grain growth. Most advantageously, the hot working occurs at a temperature between about 600 and 975° C. Hot working in this temperature range provides a relatively fine grain size, good workability and equiaxed grains.

After hot working, cooling the hot worked cobalt target blank below a temperature of about 417° C. transforms any fcc phase structure in the cobalt matrix into its hcp phase structure. After cooling to room temperature, the cobalt target blank has an initial magnetic permeability of about 12 and no detectable amount of fcc phase structure. At room temperature, the entire matrix has transformed by this grain refinement process as described above into a stable hcp phase structure, with fine equiaxed grains having an average size of less than 100 microns. For purposes of the specification, grain size represents grains measured according to ASTM E112-96.

For nickel sputter targets, the process simply involves hot working, usually hot rolling, at temperatures above the dynamic recrystallization temperature. At these temperatures, the hot working readily forms desirable equiaxed grains. Most advantageously, the hot working refines grains to an average size of less than 100 microns.

Cooling the sputter target blank to a temperature below at least −50° C. and cryogenic working the cobalt or nickel target blank at a temperature below at least −50° C. imparts strain into the grain structure. The process provides a benefit to sputter target blanks having any grain size, such as those of 500 microns or less. Advantageously, the cooled sputter target blank starts with a refined-grain structure. For purposes of this specification, a refined-grain structure is a grain structure having a shape or size determined at least in part by at least one processing step, such as that obtained from cold working, hot working, combinations of cold and hot working, recrystallization or phase transformation. Most advantageously the cryogenically cooled sputter target blank has a grain size of less than 100 microns.

The cooling medium may be any combination of solid or liquid $CO_2$, nitrogen, argon, helium, or other supercooled gas. Advantageously, the process cools the blank to about −80° C. Most advantageously, the process cools the blank to at least about −196° C. or 77 K. The most practical temperature for most applications is 77 K (liquid nitrogen at atmospheric pressure).

The cryogenic working imparts at least about 5 percent strain, as measured with respect to the thickness of the nonferrous target blank. For purposes of this specification, the strain represents engineering strain or change in thickness divided by original thickness. Advantageously, maintaining strain to a level less than about 20 percent reduces cracking for cobalt target blanks. Most advantageously, the strain is about 7 to 17 percent for cobalt target blanks. In fact, cryogenic strains at levels above about 10 percent provide little improvement in reducing the magnetic permeability of the cobalt target blank.

For nickel target blanks, a strain of at least about 5 percent will improve the sputter target's PTF uniformity. But strains of at least about 20 percent and less than about 90 percent are more effective for nickel targets. Most advantageously, nickel sputter target blanks undergo a strain of about 40 to 80 percent.

In addition to total strain, it is important to deform the blank at a reasonable strain rate. Advantageously, the strain occurs at a rate of at least 0.05 $s^{-1}$. Most advantageously, the strain occurs at a rate of at least 0.5 $s^{-1}$.

For cobalt targets, cryogenically reducing the thickness of the blank reduces the initial magnetic permeability to between about 4 and 9 as measured parallel to the top surface of the cobalt target blank and maintains the magnetic permeability at levels between about 9 and 14 as measured perpendicular to the top surface of the cobalt target blank. Most advantageously, the initial magnetic permeability reduces to between about 4 and 8 as measured parallel to the top surface of the cobalt target blank and maintains between about 9 and 12 as measured perpendicular to the top surface of the cobalt target blank. For nickel targets, the cryogenic working reduces the permeability to between 10 and 20 as measured parallel to the top surface of the nickel target blank or levels comparable to those achieved with room temperature rolling of nickel blanks. Typical permeability levels are about 14 to 17 as measured parallel to the top surface of the nickel target blank and between about 14 and 17 as measured perpendicular to the top surface of the nickel target blank.

For both cobalt and nickel sputter target blanks, the residual stresses present following cryogenic rolling deformation contribute to the overall PTF of the target blanks. Therefore, any straightening or plate leveling required for subsequent manufacturing steps must be accomplished without relieving these desirable residual stresses. For example, usage of automatic plate levelers that impose plastic bending strains should be avoided. Precise hand leveling, minimizing imposed plastic strains, are preferred. Although not easily controlled, it is possible to straighten the blank at cryogenic temperatures with automatic plate levelers.

The uniformity of magnetic properties can be expressed by comparing the PTF values at several locations at regular intervals on the target blank surface. The uniformity of PTF can be quantitatively expressed by the standard deviation of those measurements using the equation:

$$\sqrt{\frac{n\sum x^2 - (\sum x)^2}{n(n-1)}}$$

where n is the number of measurements in different locations, n is at least eight, and x is the PTF measurement. Referring to FIG. 1, a sputter target 10's PTF measurements occur on top surface 14 of sputter source 12 at each location at least 5 cm inward from the side edge 16 of the sputter source 12 before attachment to backing plate 18. Advantageously, the PTF uniformity is less than about 3.5 percent of the target's average PTF. Most advantageously, the PTF uniformity is less than about 3 percent of the target's average PTF. Further decreases in the PTF uniformity as a percentage of the target's average PTF represent additional increases or improvement in the target's PTF uniformity. PTF measurements are done per ASTM standard F1761-96 with a 740 Gauss magnet. Measurements cited here are for targets having a thickness of at least 0.5 cm.

EXAMPLE 1

A cast section of high-purity cobalt, with a purity of 99.99 weight percent, was first hot rolled upon reheating at a temperature of 800° C. The hot rolled cobalt workpiece was allowed to return to ambient temperature via air-cooling. The refined microstructure target blank having a grain size of about 53 microns was then subjected to cryogenic rolling reduction.

The cryogenic working involved first immersing a target blank in liquid nitrogen until the liquid nitrogen surrounding its surface no longer boiled. Immediately after immersing room temperature metals in liquid nitrogen, the liquid adjacent to the metal underwent "film boiling". During film boiling, the gas barrier limited heat transfer. As the temperature of the workpiece decreased and the metal approached −196° C., the gas film barrier began to break down and the liquid contacted the metal surface before boiling. Heat transfer was relatively rapid during this "nucleate boiling" phenomenon. When the workpieces approached −196° C., an audible change in boiling state signaled the transition from film to nucleate boiling. The cryogenic rolling reductions were taken in steps of no more than 0.13 mm per rolling pass, to a final total reduction of about 10% in the thickness direction. The sputtering target blank that was processed with the above thermomechanical sequence was bonded to a standard copper backing plate and machined into an Endura-style (round disk-shaped) sputtering target. A comparison of the present example processing and relevant material properties and the comparative example processing and properties is presented in Table 1 below.

Initial permeability was measured using a vibrating sample magnetometer (VSM). PTF was measured using a Hall probe and gaussmeter on a 5.1 mm thick blank at 51 mm from the blank edge using a 740 Gauss magnet in eight different locations.

Table 1—Comparison of processing steps and cobalt target properties for a comparative process and the present ivnention.

| Fabrication Parameter/ Target Property | Value | |
| --- | --- | --- |
| | Comparative Co Target | Cryogenic Co Target |
| Slice Diameter | 135 mm | 135 mm |
| Slice Thickness | 38 mm | 38 mm |
| Hot Rolling Temperature | 1150° C. | 800° C. |
| Reduction during Hot Rolling | 85% | 85% |
| Reduction per Pass | 1 mm | 1 mm |
| Cold Rolling Temperature | 25° C. | −196° C. |
| Reduction during Cold Rolling | 10% | 10% |
| Reduction per Pass | 0.13 mm | 0.13 mm |
| Initial Permeability (Parallel) | 8.5 | 7.4 |
| Initial Permeability (Perpendicular) | 13.3 | 12.2 |
| Average PTF | 291 Gauss | 350 Gauss |
| PTF Standard Deviation | 12 Gauss | 9 Gauss |
| PTF Standard Deviation/ Average PTF | 4.1% | 2.6% |
| Average Grain Size | 132 microns | 53 microns |
| Average Blank Thickness | 5.1 mm | 5.1 mm |
| Blank Thickness Standard Dev. | 0.10 mm | 0.05 mm |

As illustrated above, the process provides significant advantages over the comparative example. It provides a significant decrease in permeability, increase in average PTF, decrease in PTF standard deviation, and decrease in thickness variation.

Figure 2:
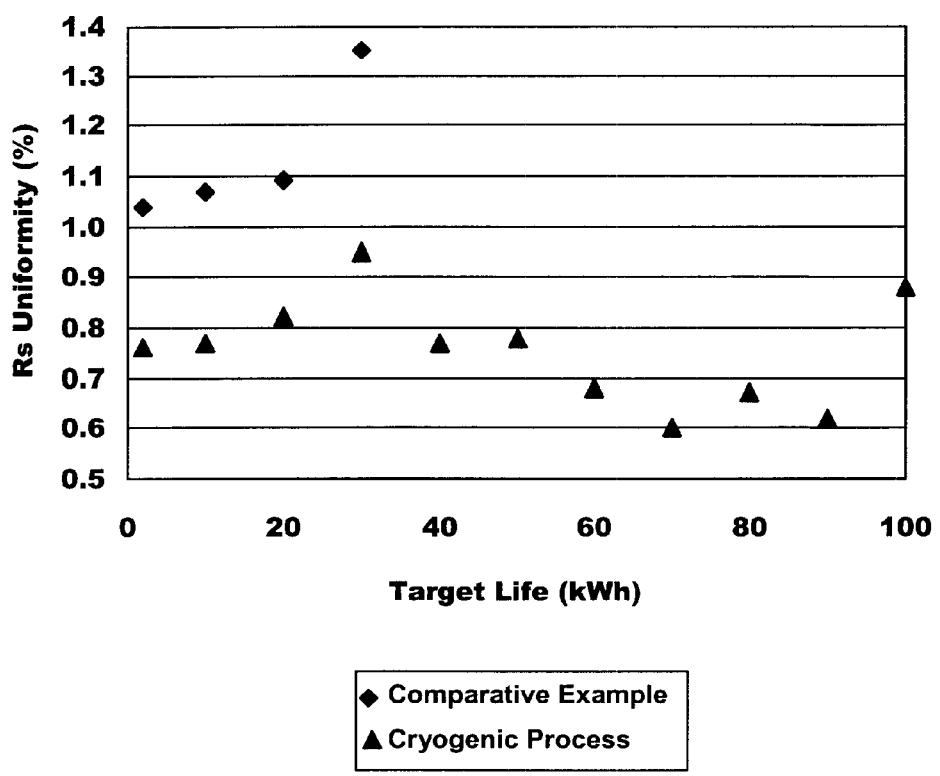
FIG. 2 shows a plot of the sheet resistance (Rs) uniformity (% 1 sigma) as a function of target life for cobalt sputter targets produced by cold working and cryogenic working.

The enhanced cobalt sputter target was then sputtered on an Endura® magnetron sputtering tool at a power of 800 Watts with 51 standard cubic centimeters per minute of argon flow in the sputtering chamber. The deposition time was 90 seconds and the wafer temperature was 20° C. Table 2 summarizes the results of the deposition uniformity of a 4 mm thick Endura cobalt target at 2–100 kWh. This target was 1 mm thicker than a normal target. Referring to FIG. 2, the cryogenic working shows a clear advantage in target performance over the comparative example, as measured by lower Rs deviations and a longer target use life. This resulted in a significant decrease in thickness variation of the deposited film even though the target was 1 mm thicker. For targets made by the process of the comparative example, an additional 1 mm thickness would be accompanied by wider variation in deposited film thickness or the inability to strike a plasma.

TABLE 2

Sheet resistance uniformity deviations (%1σ) at various spacings for a 4 mm thick Endura cobalt target at 2–100 kWh. Co target usage lifetimes are shown in kWh.

| W/C | 2 kWh | | 10 kWh | | 20 kWh | |
| --- | --- | --- | --- | --- | --- | --- |
| Distance (mm) | Wafer #1 | Wafer #2 | Wafer #1 | Wafer #2 | Wafer #1 | Wafer #2 |
| 45 | 1.96% | 1.98% | 1.93% | 1.88% | 1.99% | 1.93% |
| 47 | 1.17% | 1.89% | 1.09% | 1.09% | 1.22% | 1.12% |
| 49 | 0.73% | 0.78% | 0.76% | 0.78% | 0.79% | 0.84% |
| 51 | 0.89% | 0.87% | 1.16% | 1.16% | 1.08% | 1.06% |
| 53 | | | 1.79% | 1.71% | 1.63% | 1.58% |
| 55 | | | 2.40% | 2.41% | 2.35% | 2.22% |
| 57 | | | 3.01% | 3.00% | | |

| W/C | 30 kWh | | 40 kWh | | 50 kWh | |
| --- | --- | --- | --- | --- | --- | --- |
| Distance (mm) | Wafer #1 | Wafer #2 | Wafer #1 | Wafer #2 | Wafer #1 | Wafer #2 |
| 45 | 2.38% | 2.35% | 2.45% | 2.36% | 2.53% | 2.53% |
| 47 | 1.44% | 1.40% | 1.58% | 1.55% | 1.71% | 1.72% |

TABLE 2-continued

Sheet resistance uniformity deviations (%1σ) at various spacings for a 4 mm thick Endura cobalt target at 2–100 kWh. Co target usage lifetimes are shown in kWh.

| | | | | | | |
|---|---|---|---|---|---|---|
| 49 | 0.97% | 0.93% | 0.95% | 1.05% | 1.10% | 1.08% |
| 51 | 0.98% | 1.09% | 0.76% | 0.78% | 0.77% | 0.80% |
| 53 | 1.56% | 1.57% | 1.34% | 1.31% | 1.30% | 1.33% |
| 55 | 2.20% | 2.21% | 1.97% | 1.99% | 1.86% | 1.72% |

| W/C | 60 kWh | | 70 kWh | | 80 kWh | |
|---|---|---|---|---|---|---|
| Distance (mm) | Wafer #1 | Wafer #2 | Wafer #1 | Wafer #2 | Wafer #1 | Wafer #2 |
| 45 | | | | | | |
| 47 | 2.35% | 2.34% | | | | |
| 49 | 1.63% | 1.48% | 1.90% | 1.97% | 2.07% | 2.05% |
| 51 | 0.88% | 0.98% | 1.02% | 1.06% | 1.22% | 1.25% |
| 53 | 0.70% | 0.66% | 0.62% | 0.58% | 0.69% | 0.65% |
| 55 | 1.25% | 1.17% | 0.95% | 0.81% | 0.82% | 0.71% |
| 57 | | | 1.64% | 1.50% | 1.42% | 1.34% |
| 59 | | | | | 2.07% | 2.05% |

| W/C | 90 kWh | | 100 kWh | |
|---|---|---|---|---|
| Distance (mm) | Wafer #1 | Wafer #2 | Wafer #1 | Wafer #2 |
| 45 | | | | |
| 47 | | | | |
| 49 | 2.54% | 2.54% | 2.91% | 2.86% |
| 51 | 1.57% | 1.53% | 2.01% | 1.92% |
| 53 | 0.85% | 0.86% | 1.28% | 1.20% |
| 55 | 0.61% | 0.63% | 0.93% | 0.85% |
| 57 | 1.07% | 1.11% | 1.05% | 1.09% |
| 59 | 1.70% | 1.76% | 1.60% | 1.61% |

Note:
W/C Distance represents the wafer to cathode distance.

EXAMPLE 2

The PTF of a cobalt sputter target, having a purity of 99.99 weight percent, (prepared with a process similar to that described in Example 1) was measured following a leveling treatment on an automatic leveler, which accomplishes leveling by alternate reversing plastic bending. The average PTF was measured to be 289 Gauss for a 5.1 mm thick blank, which is significantly lower than that of Example 1 (350 Gauss). The uniformity of the PTF as reported by standard deviation was excellent, at 6 Gauss. The present example shows that cryogenic deformation of the cobalt blank ensures uniform magnetic properties, which remain uniform even after additional plastic deformation by automatic leveling. The present example also shows that the residual stresses introduced during cryogenic working are important in achieving the highest possible PTF values for cobalt targets.

EXAMPLE 3

Pure Ni target blanks, having a purity of 99.99 weight percent, were rolled to an approximate reduction of 47% in the thickness direction, with an initial thickness of 9.53 mm and a final thickness of 5.08 mm. One blank was rolled at room temperature, and the other was rolled following cryogenic cooling in liquid nitrogen. Both target blanks had an average grain size of 77 microns. The PTF of the two blanks is compared in Table 3 below.

TABLE 3

PTF mean values and standard deviations for Ni sputter targets.

| Property | Cryogenic Rolled Ni Blank | Cold Rolled Ni Blank |
|---|---|---|
| Average PTF | 170 Gauss | 174 Gauss |
| PTF Standard Deviation | 5 Gauss | 11 Gauss |
| PTF Standard Deviation/ Average PTF | 2.9% | 6.3% |
| Permeability (Parallel) | 14.2 | 16.0 |
| Permeability (Perpendicular) | 14.3 | 16.3 |

Once again, the advantage of cryogenic deformation for increasing the uniformity of magnetic properties is exemplified in this example. In addition, cryogenic rolling appears to provide about the same level of PTF benefit as cold rolling.

In summary, the invention provides a method for decreasing the magnetic permeability of high-purity-nonferrous-ferromagnetic targets. This decreased permeability allows for the production of sputter targets having an increased thickness for longer target life—the ability to sputter a thicker target and achieve better deposition uniformity allows fewer target changes in a given year. In addition to this, the process also improves the uniformity of both the magnetic properties and the sputter target's performance.

Although the invention has been described in detail with reference to certain preferred embodiments, those skilled in the art will recognize that there are other embodiments of the invention within the spirit and the scope of the claims.

We claim:

1. A method of manufacturing high-purity ferromagnetic sputter targets comprising the steps of:

cryogenic working a sputter target blank at a temperature below at least −50° C. to impart at least about 5 percent strain into the sputter target blank for increasing PTF uniformity of the sputter target blank, the sputter target blank being a nonferrous metal selected from the group consisting of cobalt and nickel and the nonferrous metal having a purity of at least about 99.99 weight percent; and fabricating the sputter target blank into the sputter target, the fabricated sputter target having an improved PTF uniformity arising from the cryogenic working.

2. The method of claim 1 wherein the cryogenic working produces a uniform PTF, the PTF uniformity being less than about 3.5 percent of the average PTF for the formula:

$$PTF\ uniformity = \sqrt{\frac{n\sum x^2 - (\sum x)^2}{n(n-1)}}$$

where n is the number of measurements at different locations, n is at least 8, and x is the PTF measurement at each location at least 5 cm inward from the side edge.

3. The method of claim 1 wherein the nonferrous metal is cobalt and the cryogenic working imparts a strain of less than about 20 percent.

4. The method of claim 1 wherein the nonferrous metal is cobalt and the cryogenic working reduces the initial magnetic permeability of the sputter target blank to between about 4 and 9 as measured parallel to the top surface of the sputter target blank and between about 9 and 14 as measured perpendicular to the top surface of the sputter target blank.

5. The method of claim 1 wherein the nonferrous metal is nickel and the cryogenic working imparts a strain of less than about 90 percent.

6. The method of claim 1 wherein the nonferrous metal is nickel and the cryogenic working reduces the initial magnetic permeability of the sputter target blank to between about 14 to 17 as measured parallel to the top surface of the nickel target blank and between about 14 and 17 as measured perpendicular to the top surface of the nickel target blank.

7. A method of manufacturing high-purity ferromagnetic sputter targets comprising the steps of:

cryogenic working a sputter target blank at a temperature below at least −50° C. to impart at least about 5 percent strain into the sputter target blank for increasing PTF uniformity of the sputter target blank, the sputter target blank being a nonferrous metal selected from the group consisting of cobalt and nickel and the nonferrous metal having a purity of at least about 99.99 weight percent;

straightening the sputter target blank to improve flatness of the sputter target blank; and fabricating the sputter target blank into the sputter target, the fabricated sputter target having an improved PTF uniformity arising from the cryogenic working.

8. The method of claim 7 wherein the nonferrous metal is cobalt and the cryogenic working imparts a strain of about 7 to 17 percent.

9. The method of claim 7 wherein the nonferrous metal is cobalt and the cryogenic working reduces the initial magnetic permeability of the sputter target blank to between about 4 and 9 as measured parallel to the top surface of the sputter target blank and between about 9 and 14 as measured perpendicular to the top surface of the sputter target blank.

10. The method of claim 7 wherein the nonferrous metal is cobalt and the cryogenic working produces a uniform PTF, the PTF uniformity being less than about 3 percent of the average PTF for the formula:

$$PTF\text{ uniformity} = \sqrt{\frac{n\sum x^2 - (\sum x)^2}{n(n-1)}}$$

where n is the number of measurements at different locations, n is at least 8, and x is the PTF measurement at each location at least 5 cm inward from the side edge.

11. The method of claim 7 wherein the nonferrous metal is nickel and the cryogenic working imparts a strain of about 20 to 90 percent.

12. The method of claim 7 wherein the nonferrous metal is nickel and the cryogenic working reduces the initial magnetic permeability of the sputter target blank to between about 14 to 17 as measured parallel to the top surface of the nickel target blank and between about 14 and 17 as measured perpendicular to the top surface of the nickel target blank.

13. The method of claim 7 wherein the straightening occurs with controlled bending of selected portions of the sputter target blank.

14. The method of claim 7 including the additional step of hot working to refine grain size of the sputter target blank to less than 100 microns.

\* \* \* \* \*